United States Patent
Raghu et al.

(10) Patent No.: US 9,785,357 B2
(45) Date of Patent: Oct. 10, 2017

(54) SYSTEMS AND METHODS FOR SAMPLING DATA AT A NON-VOLATILE MEMORY SYSTEM

(71) Applicant: SanDisk Technologies Inc., Plano, TX (US)

(72) Inventors: Deepak Raghu, Milpitas, CA (US); Chris Aviala, Saratoga, CA (US); Harish Singidi, Santa Clara, CA (US); Guirong Liang, Santa Clara, CA (US); Anne Pao-Ling Koh, Femont, CA (US); Dana Lee, Saratoga, CA (US); Gautam Dusija, Milpitas, CA (US)

(73) Assignee: SANDISK TECHNOLOGIES LLC, Plano, TX (US)

( * ) Notice: Subject to any disclaimer, the term of this patent is extended or adjusted under 35 U.S.C. 154(b) by 22 days.

(21) Appl. No.: 14/918,050

(22) Filed: Oct. 20, 2015

(65) Prior Publication Data

US 2017/0109040 A1    Apr. 20, 2017

(51) Int. Cl.
G06F 3/06    (2006.01)

(52) U.S. Cl.
CPC ............ *G06F 3/061* (2013.01); *G06F 3/0619* (2013.01); *G06F 3/0647* (2013.01); *G06F 3/0679* (2013.01)

(58) Field of Classification Search
None
See application file for complete search history.

(56) References Cited

U.S. PATENT DOCUMENTS

2016/0148702 A1*  5/2016  Karakulak ............ G11C 16/26
                                                 365/185.12

* cited by examiner

*Primary Examiner* — Baboucarr Faal
(74) *Attorney, Agent, or Firm* — Brinks Gilson & Lione (57) ABSTRACT

Systems and methods for sampling data at a non-volatile memory system are disclosed. In one implementation, a controller of a non-volatile memory system that is coupled with a host device acquires a read level voltage of a first word line of a memory block of a non-volatile memory of the non-volatile memory system. The controller accesses one or more lookup tables to determine an offset voltage for a second word line of the memory block based on a program/erase count and a read/disturb count associated with the memory block; applies the read level voltage and the offset voltage to the second word line to sample data stored at the memory block; and determines whether the data sampled from the memory block contains errors.

20 Claims, 8 Drawing Sheets

SYSTEMS AND METHODS FOR SAMPLING DATA AT A NON-VOLATILE MEMORY SYSTEM

BACKGROUND

In non-volatile memory systems, a controller performs operations when moving data between different blocks of memory to check for errors in the data. In many conventional procedures, a controller of a non-volatile memory system may examine data at each word line of a memory block prior to the transfer of data to check for errors in the data. However, checking data at each word line of a memory block prior to moving the data can be time consuming and greatly reduce performance of the memory system.

In other conventional procedures, a controller of a non-volatile memory system samples a limited amount of data at a memory block for errors prior to transfer to a second memory block. The controller then verifies the data stored at the second memory block after the transfer. However, the additional read operations after the transfer can also greatly reduce performance of the memory system.

More advance techniques for ensuring that data is correctly transferred between different blocks of memory is desirable.

DETAILED DESCRIPTION OF THE DRAWINGS

The present disclosure is directed to systems and methods for sampling data at a non-volatile memory system. The non-volatile memory systems described in the present application may utilize one or more offset voltage lookup tables that allow a controller and a read level voltage acquisition module of the controller to efficiently verify data at a first memory block of the non-volatile memory system before transferring the data to a second memory block of the non-volatile memory system during operations such as performing an on-chip copy operation.

As explained in more detail below, to efficiently verify data, the controller and the read level voltage acquisition module sample data stored at a memory block based on relationships between word lines of the memory blocks and characteristics of the non-volatile memory system such as a life stage of a memory block, a program/erase count of a memory block, a program/disturb count of a memory block, a read/disturb count of a memory block, and/or a level of data retention at a memory block. Further, during operation of the non-volatile memory system, the read level voltage acquisition module is able to dynamically update the relationships between the word lines of the memory blocks.

In a one embodiment, a method is disclosed. The elements of the method occur in a controller of a non-volatile memory system that is coupled with a host device. In the method, the controller acquires a read level voltage of a first word line associated with a memory block of a non-volatile memory of the non-volatile memory system and accesses a lookup table to determine an offset voltage for a second word line associated with the memory block based on a program/erase count and a read/disturb count associated with the memory block. The controller applies the read level voltage and the offset voltage to the second word line to sample data stored at the memory block and determines whether the data sampled from the memory block contains errors.

In another embodiment, an apparatus comprising a non-volatile memory and controller in communication with the non-volatile memory is disclosed. The controller is configured to acquire a read level voltage of a first word line of a memory block of the non-volatile memory, determine an offset voltage for a second word line of the memory block based on one or more characteristics of the memory block, and sample data stored at the memory block using the read level voltage and the offset voltage.

In yet another embodiment, another method is disclosed. The elements of the method occur in a controller of a non-volatile memory system that is coupled with a host device. In the method, the read level voltage acquisition module updates a lookup table to reflect a relationship between a read level voltage of a first word line of a memory block of the non-volatile memory of the non-volatile memory system and a read level voltage of a second word line of the memory block.

The controller updates the relationship between the read level voltage of the first word line and the read level voltage of the second word line based on at least one of a life stage of the memory block, a program/erase count of the memory block, a program/disturb count of the memory block, a read/disturb count of the memory block, or a level of data retention of the memory block.

Other embodiments are possible, and each of the embodiments can be used alone or together in combination. Accordingly, various embodiments will be described with reference to the attached drawings.

Figures 1A, 1B:
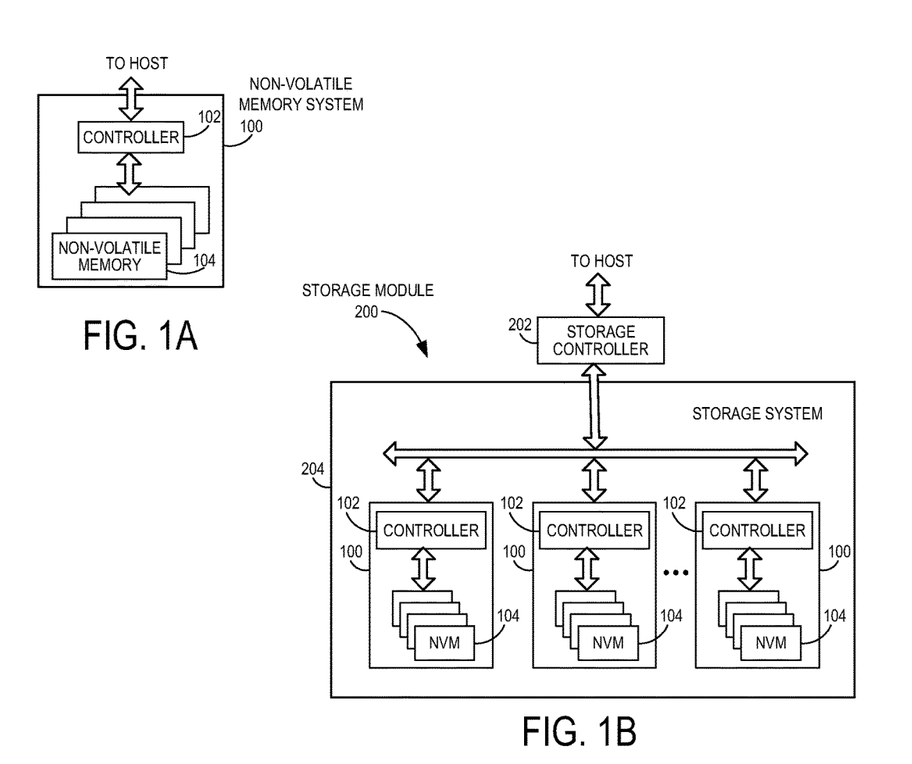
FIG. 1A is a block diagram of an example non-volatile memory system.
FIG. 1B is a block diagram illustrating an exemplary storage module.
Figure 1C:
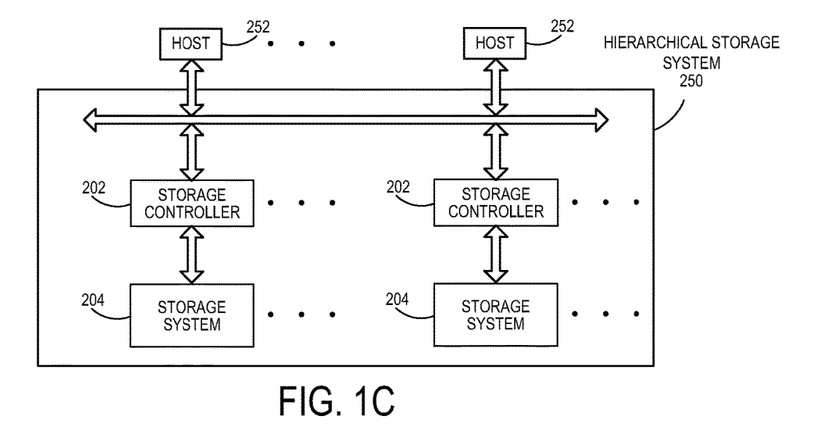
FIG. 1C is a block diagram illustrating a hierarchical storage system.

Memory systems suitable for use in implementing aspects of these embodiments are shown in FIGS. 1A-1C. FIG. 1A is a block diagram illustrating a non-volatile memory system according to an embodiment of the subject matter described herein. Referring to FIG. 1A, non-volatile memory system 100 includes a controller 102 and non-volatile memory that may be made up of one or more non-volatile memory die 104. As used herein, the term die refers to the collection of non-volatile memory cells, and associated circuitry for managing the physical operation of those non-volatile memory cells, that are formed on a single semiconductor substrate. Controller 102 interfaces with a host system and transmits command sequences for read, program, and erase operations to non-volatile memory die 104.

The controller 102 (which may be a flash memory controller) can take the form of processing circuitry, a microprocessor or processor, and a computer-readable medium that stores computer-readable program code (e.g., software or firmware) executable by the (micro)processor, logic gates, switches, an application specific integrated circuit (ASIC), a programmable logic controller, and an embedded microcontroller, for example. The controller 102 can be configured with hardware and/or firmware to perform the various functions described below and shown in the flow diagrams. Also, some of the components shown as being internal to the controller can also be stored external to the controller, and other components can be used. Additionally, the phrase "operatively in communication with" could mean directly in communication with or indirectly (wired or wireless) in communication with through one or more components, which may or may not be shown or described herein.

As used herein, a flash memory controller is a device that manages data stored on flash memory and communicates with a host, such as a computer or electronic device. A flash memory controller can have various functionality in addition to the specific functionality described herein. For example, the flash memory controller can format the flash memory to ensure the memory is operating properly, map out bad flash memory cells, and allocate spare cells to be substituted for future failed cells. Some part of the spare cells can be used to hold firmware to operate the flash memory controller and implement other features. In operation, when a host needs to read data from or write data to the flash memory, it will communicate with the flash memory controller. If the host provides a logical address to which data is to be read/written, the flash memory controller can convert the logical address received from the host to a physical address in the flash memory. (Alternatively, the host can provide the physical address.) The flash memory controller can also perform various memory management functions, such as, but not limited to, wear leveling (distributing writes to avoid wearing out specific blocks of memory that would otherwise be repeatedly written to) and garbage collection (after a block is full, moving only the valid pages of data to a new block, so the full block can be erased and reused).

Non-volatile memory die 104 may include any suitable non-volatile storage medium, including NAND flash memory cells and/or NOR flash memory cells. The memory cells can take the form of solid-state (e.g., flash) memory cells and can be one-time programmable, few-time programmable, or many-time programmable. The memory cells can also be single-level cells (SLC), multiple-level cells (MLC), triple-level cells (TLC), or use other memory technologies, now known or later developed. Also, the memory cells can be arranged in a two-dimensional or three-dimensional fashion.

The interface between controller 102 and non-volatile memory die 104 may be any suitable flash interface, such as Toggle Mode 200, 400, or 800. In one embodiment, memory system 100 may be a card based system, such as a secure digital (SD) or a micro secure digital (micro-SD) card. In an alternate embodiment, memory system 100 may be part of an embedded memory system.

Although, in the example illustrated in FIG. 1A, non-volatile memory system 100 includes a single channel between controller 102 and non-volatile memory die 104, the subject matter described herein is not limited to having a single memory channel. For example, in some NAND memory system architectures, 2, 4, 8 or more NAND channels may exist between the controller and the NAND memory device, depending on controller capabilities. In any of the embodiments described herein, more than a single channel may exist between the controller and the memory die, even if a single channel is shown in the drawings.

FIG. 1B illustrates a storage module 200 that includes plural non-volatile memory systems 100. As such, storage module 200 may include a storage controller 202 that interfaces with a host and with storage system 204, which includes a plurality of non-volatile memory systems 100. The interface between storage controller 202 and non-volatile memory systems 100 may be a bus interface, such as a serial advanced technology attachment (SATA) or peripheral component interface express (PCIe) interface. Storage module 200, in one embodiment, may be a solid state drive (SSD), such as found in portable computing devices, such as laptop computers, and tablet computers.

FIG. 1C is a block diagram illustrating a hierarchical storage system. A hierarchical storage system 250 includes a plurality of storage controllers 202, each of which controls a respective storage system 204. Host systems 252 may access memories within the storage system via a bus interface. In one embodiment, the bus interface may be a non-volatile memory express (NVMe) or a fiber channel over Ethernet (FCoE) interface. In one embodiment, the system illustrated in FIG. 1C may be a rack mountable mass storage system that is accessible by multiple host computers, such as would be found in a data center or other location where mass storage is needed.

Figure 2A:
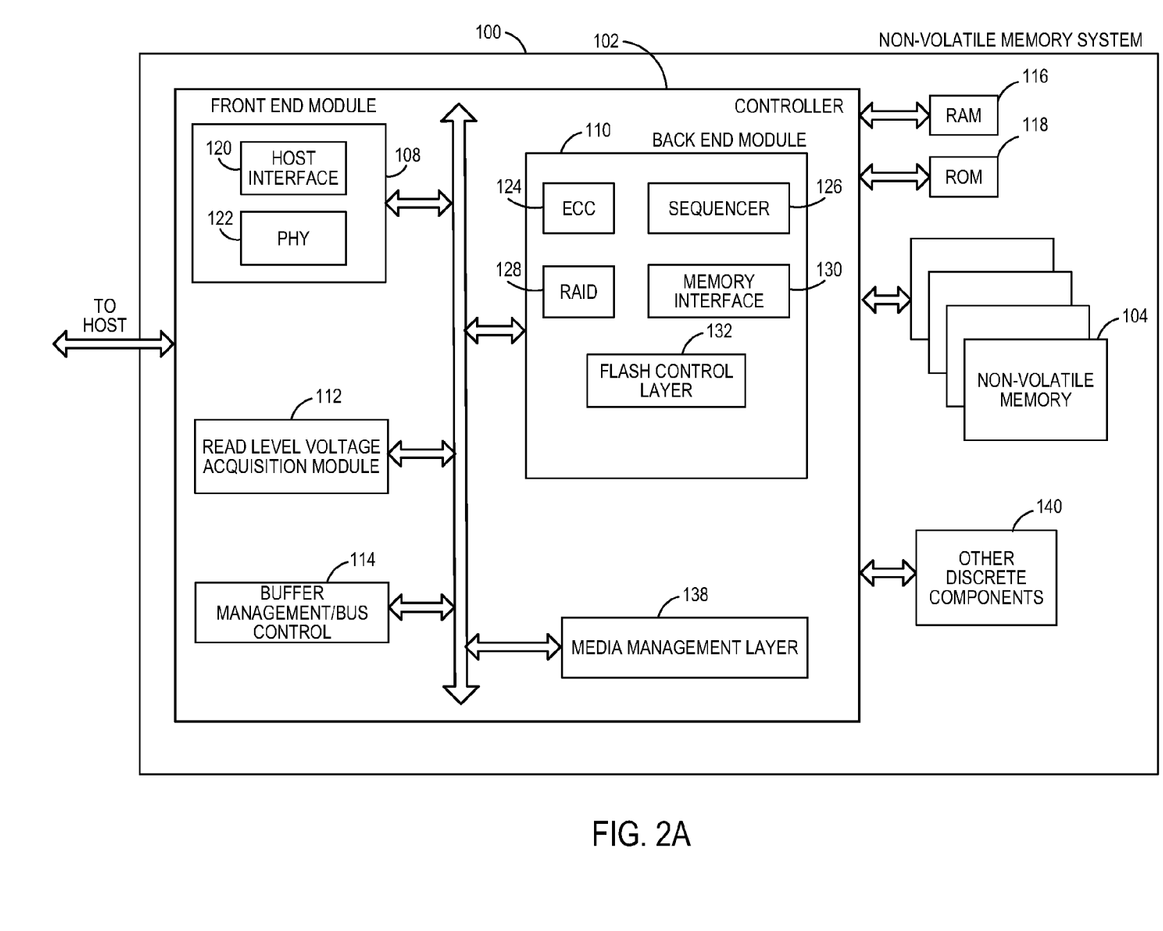
FIG. 2A is a block diagram illustrating exemplary components of a controller of a non-volatile memory system.

FIG. 2A is a block diagram illustrating exemplary components of controller 102 in more detail. Controller 102 includes a front end module 108 that interfaces with a host, a back end module 110 that interfaces with the one or more non-volatile memory die 104, and various other modules that perform functions which will now be described in detail. A module may take the form of a packaged functional hardware unit designed for use with other components, a portion of a program code (e.g., software or firmware) executable by a (micro)processor or processing circuitry that usually performs a particular function of related functions, or a self-contained hardware or software component that interfaces with a larger system, for example.

Modules of the controller 102 may include a read level voltage acquisition module 112 present on the die of the controller 102. As explained in more detail below in conjunction with FIGS. 7-9, the read level voltage acquisition module 112 may dynamically determine relationships between word lines of a memory block based on factors such as a life stage of the memory block, a program/erase count of the memory block, a program/disturb count of the memory block, a read/disturb count of the memory block, and/or a level of data retention of the memory block. When a controller 102 and/or the read level voltage acquisition module 112 samples data stored at the memory block, the read level voltage acquisition module 112 acquires a read level voltage of a word line of a memory block and then utilizes the acquired relationships for other word lines of the memory block to sample data stored at the memory block.

Referring again to modules of the controller 102, a buffer manager/bus controller 114 manages buffers in random access memory (RAM) 116 and controls the internal bus arbitration of controller 102. A read only memory (ROM) 118 stores system boot code. Although illustrated in FIG. 2A as located separately from the controller 102, in other embodiments one or both of the RAM 116 and ROM 118 may be located within the controller. In yet other embodiments, portions of RAM and ROM may be located both within the controller 102 and outside the controller. Further, in some implementations, the controller 102, RAM 116, and ROM 118 may be located on separate semiconductor die.

Front end module 108 includes a host interface 120 and a physical layer interface (PHY) 122 that provide the electrical interface with the host or next level storage controller. The choice of the type of host interface 120 can depend on the type of memory being used. Examples of host interfaces 120 include, but are not limited to, SATA, SATA Express, SAS, Fibre Channel, USB, PCIe, and NVMe. The host interface 120 typically facilitates transfer for data, control signals, and timing signals.

Back end module 110 includes an error correction controller (ECC) engine 124 that encodes the data bytes received from the host, and decodes and error corrects the data bytes read from the non-volatile memory. A command sequencer 126 generates command sequences, such as program and erase command sequences, to be transmitted to non-volatile memory die 104. A RAID (Redundant Array of Independent Drives) module 128 manages generation of RAID parity and recovery of failed data. The RAID parity may be used as an additional level of integrity protection for the data being written into the non-volatile memory system 100. In some cases, the RAID module 128 may be a part of the ECC engine 124. A memory interface 130 provides the command sequences to non-volatile memory die 104 and receives status information from non-volatile memory die 104. In one embodiment, memory interface 130 may be a double data rate (DDR) interface, such as a Toggle Mode 200, 400, or 800 interface. A flash control layer 132 controls the overall operation of back end module 110.

Additional components of system 100 illustrated in FIG. 2A include media management layer 138, which performs wear leveling of memory cells of non-volatile memory die 104. System 100 also includes other discrete components 140, such as external electrical interfaces, external RAM, resistors, capacitors, or other components that may interface with controller 102. In alternative embodiments, one or more of the physical layer interface 122, RAID module 128, media management layer 138 and buffer management/bus controller 114 are optional components that are not necessary in the controller 102.

Figure 2B:
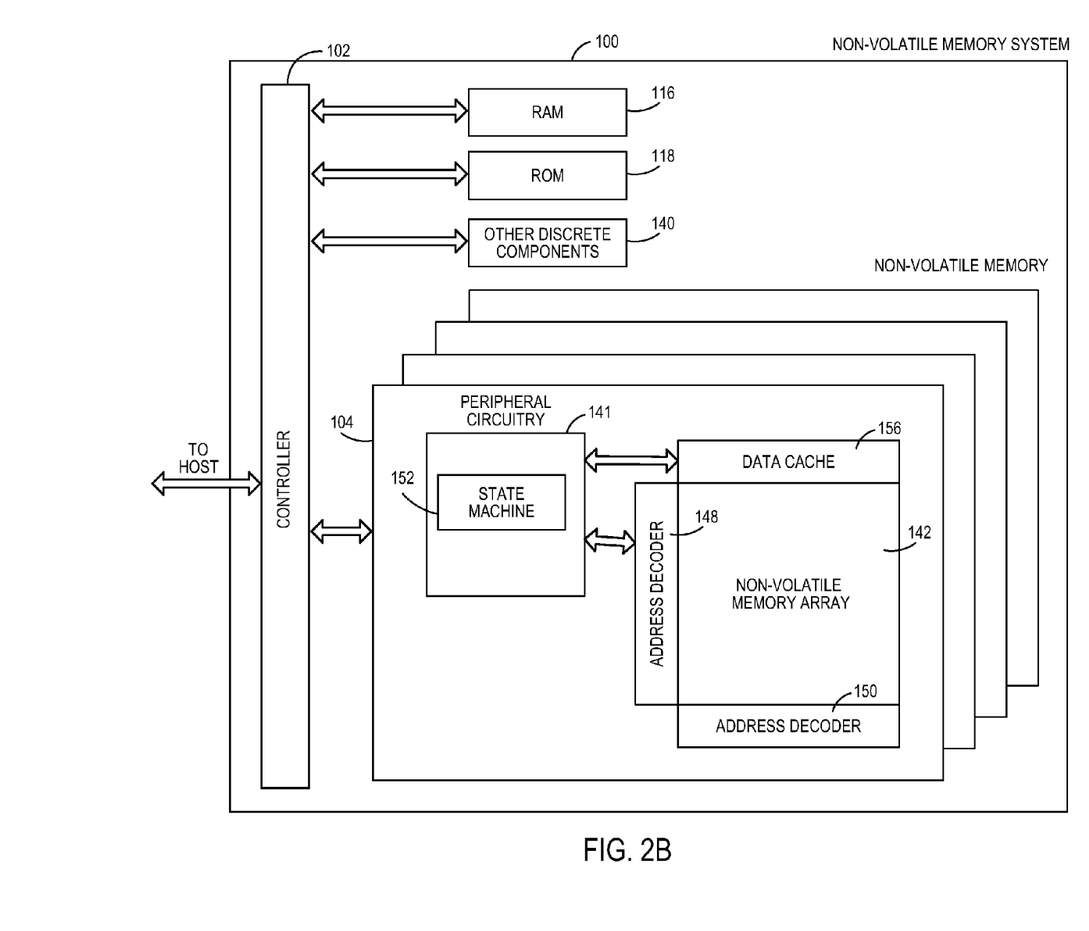
FIG. 2B is a block diagram illustrating exemplary components of a non-volatile memory of a non-volatile memory storage system.

FIG. 2B is a block diagram illustrating exemplary components of non-volatile memory die 104 in more detail. Non-volatile memory die 104 includes peripheral circuitry 141 and non-volatile memory array 142. Non-volatile memory array 142 includes the non-volatile memory cells used to store data. The non-volatile memory cells may be any suitable non-volatile memory cells, including NAND flash memory cells and/or NOR flash memory cells in a two dimensional and/or three dimensional configuration. Peripheral circuitry 141 includes a state machine 152 that provides status information to controller 102. Non-volatile memory die 104 further includes a data cache 156 that caches data.

Each non-volatile memory die 104 may contain an array of memory cells organized into multiple planes. An example NAND array is illustrated in FIG. 3.

Figure 3:
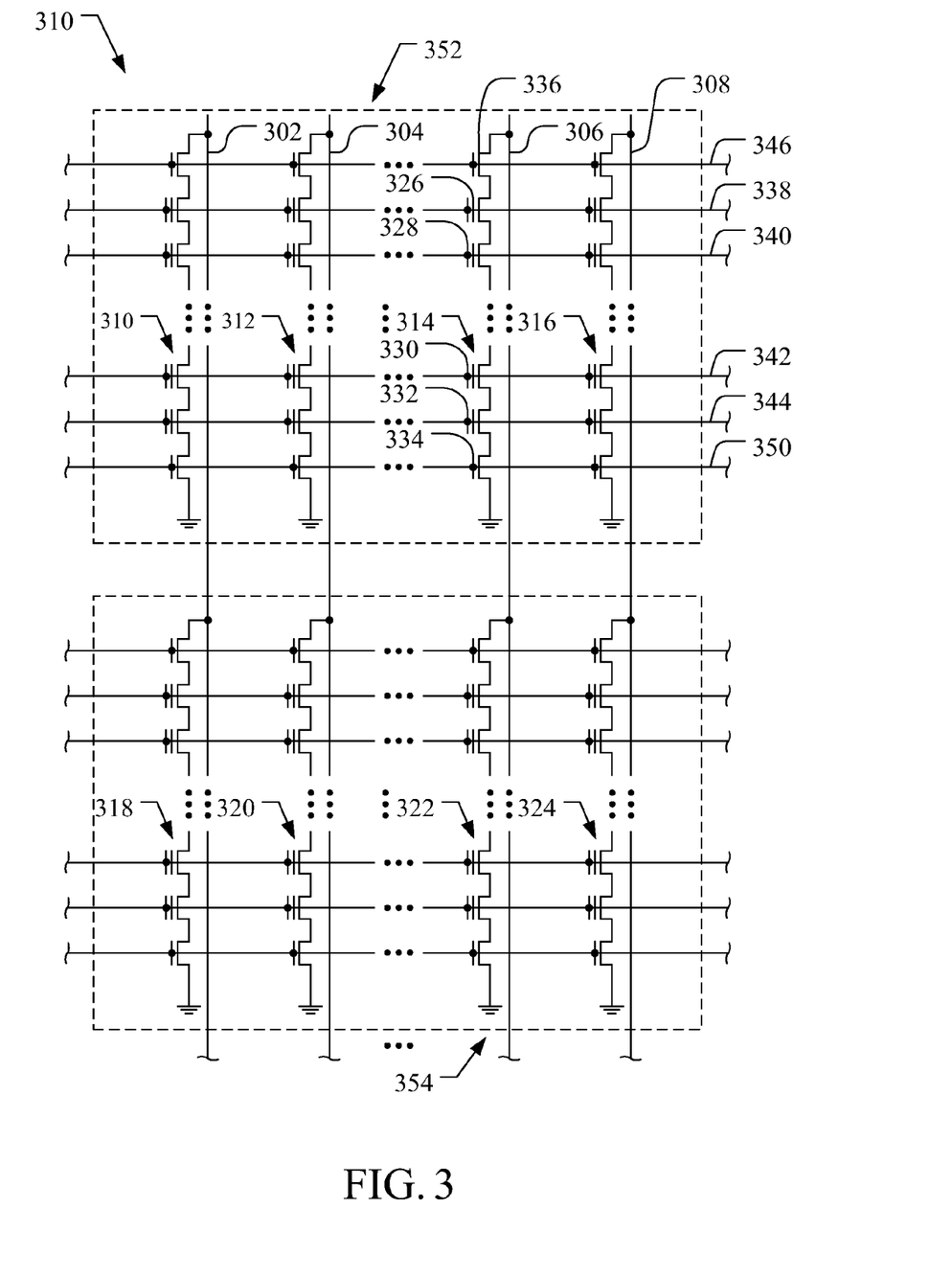
FIG. 3 is a representative circuit diagram of a memory cell array.

While a large number of global bit lines are provided in a NAND array, only four such lines 302-308 are shown in FIG. 3 for simplicity of explanation. A number of series connected memory cell strings 310-324 are connected between one of these bit lines and a reference potential. Using the memory cell string 314 as representative, a plurality of charge storage memory cells 326-332 are connected in series with select transistors 334 and 336 at either end of the string. When the select transistors of a string are rendered conductive, the string is connected between its bit line and the reference potential. One memory cell within that string is then programmed or read at a time.

Word lines 338-344 of FIG. 3 individually extend across the charge storage element of one memory cell in each of a number of strings of memory cells, and gates 346 and 350 control the states of the select transistors at each end of the strings. The memory cell strings that share common word and control gate lines 338-350 are made to form a block 352 of memory cells that are erased together. This block of cells contains the minimum number of cells that are physically erasable at one time. One row of memory cells, those along one of the word lines 338-344, are programmed at a time. Typically, the rows of a NAND array are programmed in a prescribed order, in this case beginning with the row along the word line 344 closest to the end of the strings connected to ground or another common potential. The row of memory cells along the word line 342 is programmed next, and so on, throughout the block 352. However, in other implementations, the rows of a NAND array are not programmed in sequential order.

A second block 354 is similar, its strings of memory cells being connected to the same global bit lines as the strings in the first block 352 but having a different set of word and control gate lines. The word and control gate lines are driven to their proper operating voltages by row control circuits. If there is more than one plane in the system, one memory architecture uses common word lines extending between them. There can alternatively be more than two planes that share common word lines. In other memory architectures, the word lines of individual planes are separately driven.

The memory cells may be operated to store two levels of charge so that a single bit of data is stored in each cell. This is typically referred to as a binary or single level cell (SLC) memory. Alternatively, the memory cells may be operated to store more than two detectable levels of charge in each charge storage element or region, thereby to store more than one bit of data in each. This latter configuration is referred to as multi level cell (MLC) memory. Both types of memory cells may be used in a memory. For example, binary flash memory may be used for caching data and MLC memory may be used for longer term storage. The charge storage elements of the memory cells are most commonly conductive floating gates but may alternatively be non-conductive dielectric charge trapping material.

In implementations of MLC memory operated to store two bits of data in each memory cell, each memory cell is configured to store four levels of charge corresponding to values of "11," "01," "10," and "00." Each bit of the two bits of data may represent a page bit of a lower page or a page bit of an upper page, where the lower page and upper page span across a series of memory cells sharing a common word line. Typically, the less significant bit of the two bits of data represents a page bit of a lower page and the more significant bit of the two bits of data represents a page bit of an upper page.

Figure 4:
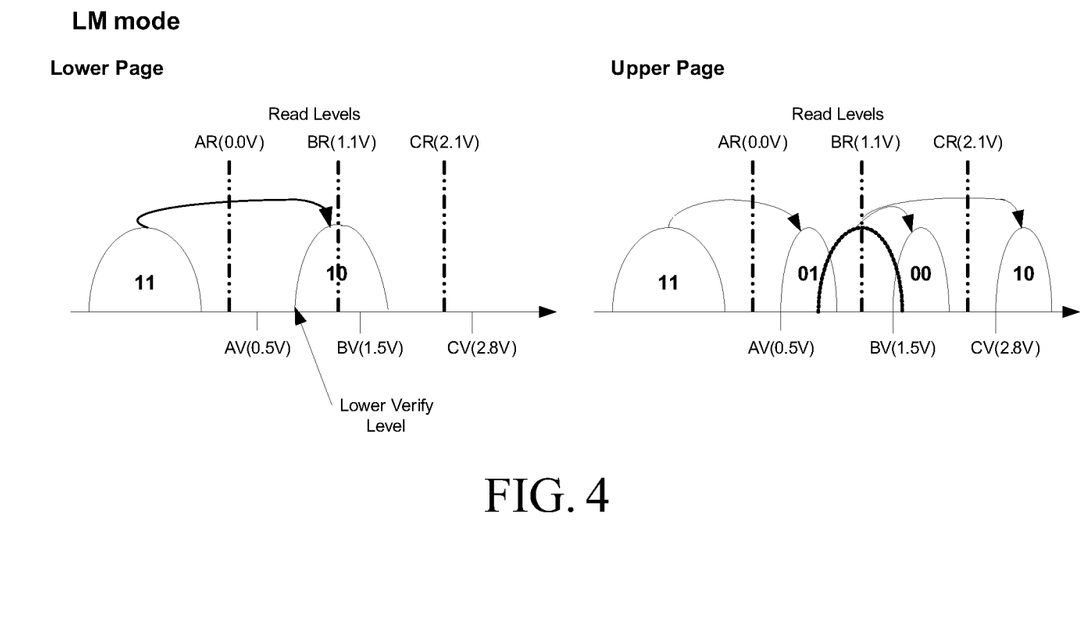
FIG. 4 illustrates charge levels in a MLC memory operated to store two bits of data in a memory cell.

FIG. 4 illustrates one implementation of the four charge levels used to represent two bits of data in a memory cell. A value of "11" corresponds to an un-programmed state of the memory cell. When programming pulses are applied to the memory cell to program a page bit of the lower page, the level of charge is increased to represent a value of "10" corresponding to a programmed state of the page bit of the lower page.

For a page bit of an upper page, when the page bit of the lower page is programmed (a value of "10"), programming pulses are applied to the memory cell for the page bit of the upper page to increase the level of charge to correspond to a value of "00" or "10" depending on the desired value of the page bit of the upper page. However, if the page bit of the lower page is not programmed such that the memory cell is in an un-programmed state (a value of "11"), applying programming pulses to the memory cell to program the page bit of the upper page increases the level of charge to represent a value of "01" corresponding to a programmed state of the page bit of the upper page.

Figure 5:
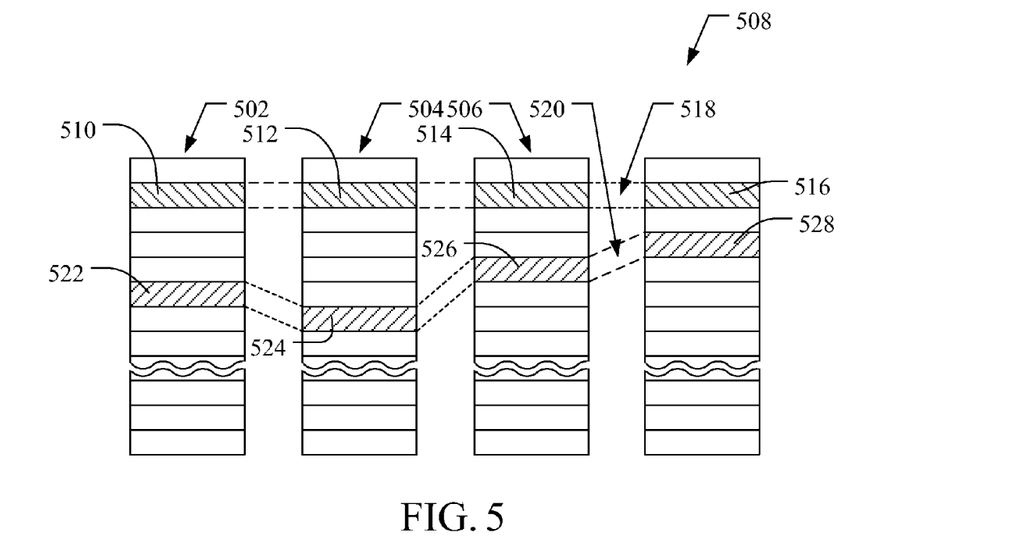
FIG. 5 illustrates an example physical memory organization of a memory bank.

FIG. 5 conceptually illustrates a multiple plane arrangement showing four planes 502-508 of memory cells. These planes 502-508 may be on a single die, on two die (two of the planes on each die) or on four separate die. Of course, other numbers of planes, such as 1, 2, 8, 16 or more may exist in each die of a system. The planes are individually divided into blocks of memory cells shown in FIG. 5 by rectangles, such as blocks 510, 512, 514 and 516, located in respective planes 502-508. There can be dozens or hundreds or thousands or more of blocks in each plane.

As mentioned above, a block of memory cells is the unit of erase, the smallest number of memory cells that are physically erasable together. Some non-volatile memory systems, for increased parallelism, operate the blocks in larger metablock units. However, other memory systems may utilize asynchronous memory die formations rather than operating in larger metablock units.

In non-volatile memory systems utilizing metablock units, one block from each plane is logically linked together to form the metablock. The four blocks 510-516 are shown to form one metablock 518. All of the cells within a metablock are typically erased together. The blocks used to form a metablock need not be restricted to the same relative locations within their respective planes, as is shown in a second metablock 520 made up of blocks 522-528. Although it is usually preferable to extend the metablocks across all of the planes, for high system performance, the non-volatile memory systems can be operated with the ability to dynamically form metablocks of any or all of one, two or three blocks in different planes. This allows the size of the metablock to be more closely matched with the amount of data available for storage in one programming operation.

Figure 6:
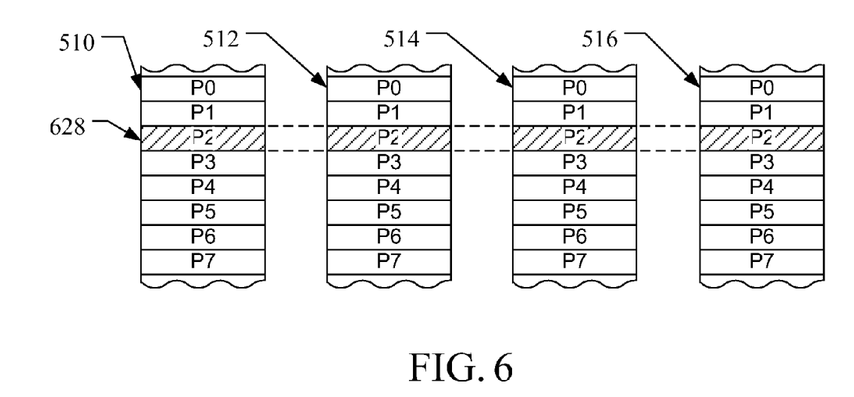
FIG. 6 shows an expanded view of a portion of the physical memory of FIG. 5.

The individual blocks are in turn divided for operational purposes into pages of memory cells, as illustrated in FIG. 6. The memory cells of each of the blocks 510-516, for example, are each divided into eight pages P0-P7. Alternatively, there may be 32, 64 or more pages of memory cells within each block. The page is the unit of data programming and reading within a block, containing the minimum amount of data that are programmed or read at one time. However, in order to increase the memory system operational parallelism, such pages within two or more blocks may be logically linked into metapages. A metapage 628 is illustrated in FIG. 6, being formed of one physical page from each of the four blocks 510-516. The metapage 628, for example, includes the page P2 in each of the four blocks but the pages of a metapage need not necessarily have the same relative position within each of the blocks.

As mentioned above, when transferring data from a first memory block to a second memory block, such as when transferring data from a memory block of SLC memory cells to a memory block of MLC memory cells during an on-chip copy operation, a controller of a non-volatile memory system performs operations to ensure that data is correctly transferred between the two memory blocks. For example, when a controller performs operations to move data from a first memory block to a second memory block, a read level voltage acquisition module of the controller may first sample the data stored at the first memory block for errors.

In sampling the data stored at the first memory block, the read level voltage acquisition module acquires a read level voltage for a word line of the memory block. A read level voltage for a word line is acquired by applying a voltage level on a word line, and after ECC decoding, determining a number of error bits that occur during the read at the applied voltage level. This process is repeated for different voltage levels until the voltage level that results in the fewest number of errors is determined. The read level voltage is defined to be the voltage level that results in the fewest number of errors. In some implementations, the voltage levels that are tested are predefined in a table that is stored at the non-volatile memory system.

The read level voltage acquisition module additionally determines an offset voltage from the read level voltage to read and sample data from one or more other word lines of the memory block. The read level acquisition module determines the offset voltage based on factors such as a life stage of the memory block, a program/erase count of the memory block, a program/disturb count of the memory block, a read/disturb count of the memory block, and/or a level of data retention of the memory block. After determining the offset voltage for one or more other word lines, the controller utilizes the read level voltage and offset voltage to sample data at one or more other word lines of the memory block.

Unlike conventional techniques where the same read level voltage is applied to all word lines of the memory block, in the non-volatile memory systems described in the present application, the read level voltage acquisition module is able to adaptively determine an appropriate read level voltage and offset voltage for word lines of a memory block as the memory cells and word lines of the memory block change over the life of a non-volatile memory system. Being able to adapt to the changes in memory cells and word lines based on factors such as a life stage of a memory block, a program/erase count of a memory block, a program/disturb count of a memory block, a read/disturb count of a memory block, and/or a level of data retention of a memory block allows the controller of the non-volatile memory system to prevent errors from being transferred between memory blocks when data is transferred from one memory block to another.

Figure 7:
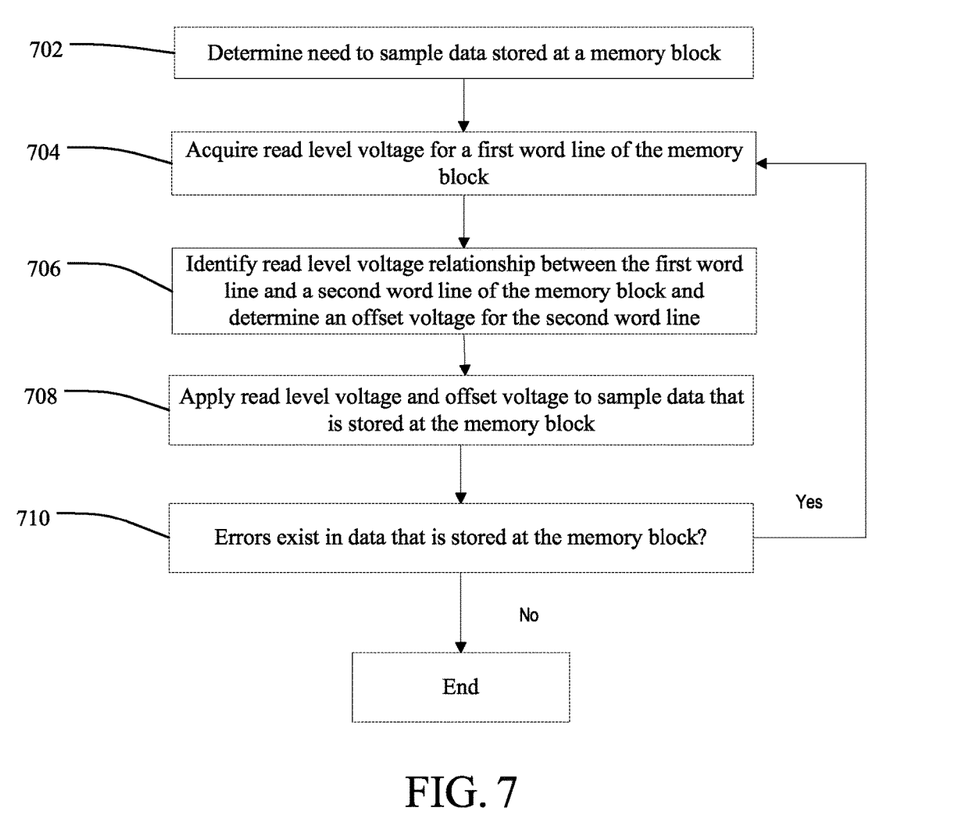
FIG. 7 is a flow chart of one implementation of a method for sampling data stored at a memory block.

FIG. 7 is a flow chart of one implementation of a method for sampling data of a memory block. At step 702, a controller of a non-volatile memory system determines a need to sample data stored at a first group of memory cells, such as a set of single level memory cells of a first memory block. In some implementations, the controller may determines to sample the data prior to transferring the data to a second set of memory cells, such as a group of triple level memory cells of a second memory block.

At step 704, a read level voltage acquisition module determines a read level voltage for a first word line of the memory block. In some implementations, the read level voltage acquisition module determines the read level of voltages by applying a number of voltages to the word line and determining the voltage level that results in the fewest number of errors. The read level voltage acquisition module defines the read level to be the determined voltage level that resulted in the fewest number of errors. Examples of techniques for determining a read level voltage can be found in U.S. Pat. No. 8,713,380, assigned to SanDisk Technologies, Inc.

At step 706, the read level voltage acquisition module both determines that a second word line of the memory block is associated with the first word line of the memory block and determines an offset voltage for the second word line of the memory block. In some implementations, to determine that the second word line is associated with the first word line and to determine the offset voltage, the read level acquisition module accesses one or more lookup tables such as one or more offset voltage tables stored at the non-volatile memory system. When accessing the one or more offset voltage tables, the read level voltage acquisition module may further utilize one or more factors such as a life stage of the memory block, a program/erase count of the memory block, a program/disturb count of the memory block, a read/disturb count of the memory block, and/or a level of data retention of the memory block to determine the offset voltage.

For example, as shown in Tables 1 and 2 below, the read level voltage acquisition module may utilize two tables to determine for a second word line of a memory block whose P/E count indicates that the memory block is at mid-life stage, and whose read/disturb count is between 5,000 and 10,000, that the offset voltage is 3 digital-analog conversion ("DAC"). In some implementations, 1 DAC represents 100 mV.

In the example below, the read level voltage acquisition module initially accesses a table to determine which word line the second word line is related to. Table 1 illustrates that the second word line of the memory block is associated with the first word line of the memory block.

The read level voltage acquisition module then accesses another table to determine offset voltage for the second word line. Because the memory block is at mid-life stage and the read/disturb count for the memory block is between 5,000 and 10,000, the offset voltage is 3 DAC from the acquired read level voltage of the first word line.

TABLE 1

Example Word Line Association Table

| Word Line | Associated Word Line |
|---|---|
| Word line 0 | Acquired Read Level Voltage |
| Word line 1 | Acquired Read Level Voltage |
| Word line 2 | Word line 1 |
| Word line 3 | Acquired Read Level Voltage |
| Word line 4 | Word line 0 |
| Word line 5 | Word line 3 |
| Word line 6 | Word line 3 |
| ... | ... |
| Word line n | Acquired Read Level Voltage |

TABLE 2

Example Offset Voltage Lookup Table for Second Word Line

| | R/D Count 0-5,000 | R/D Count 5,000-10,000 |
|---|---|---|
| P/E Count Beginning of Life | Acquired Read Level Voltage + 1 DAC | Acquired Read Level Voltage + 2 DAC |
| P/E Count Middle of Life | Acquired Read Level Voltage + 2 DAC | Acquired Read Level Voltage + 3 DAC |
| P/E Count End of Life | Acquired Read Level Voltage + 3 DAC | Acquired Read Level Voltage + 4 DAC |

In some implementations, the controller and/or the read level voltage acquisition module may generate one or more offset voltage lookup tables based on an analysis of empirical data observed at the non-volatile memory system or based on an analysis of empirical data from other similar non-volatile memory system. In further implementations, the controller and/or the read level voltage acquisition module may generate the offset voltage lookup table by periodically acquiring relationships between the different word lines of the memory block. The generation of one or more offset voltage lookup tables is described in more detail below in conjunction with FIGS. 8 and 9.

At step 708, the controller and/or the read level voltage acquisition module applies the read level voltage acquired at step 704 and the offset voltage acquired at step 706 to the second word line to sample data of the memory block. At step 710, the controller and/or the read level acquisition module determines whether one or more errors exist in the sampled data of the memory block.

When the controller determines that one or more errors exist in the sampled data, the controller repeats the above-described process beginning at step 704 with the read level voltage acquisition module determining a read level voltage for a first word line of the memory block.

When the controller determines that errors do not exist within the sampled data, the method ends.

It will be appreciated that the above-described method may be implemented for multiple word lines during the sampling of a memory block. For example, when determining the offset voltage for the second word line, the read level acquisition module may also determine an offset voltage for third, fourth, etc. word lines for use in sampling data of the memory block.

Figure 8:
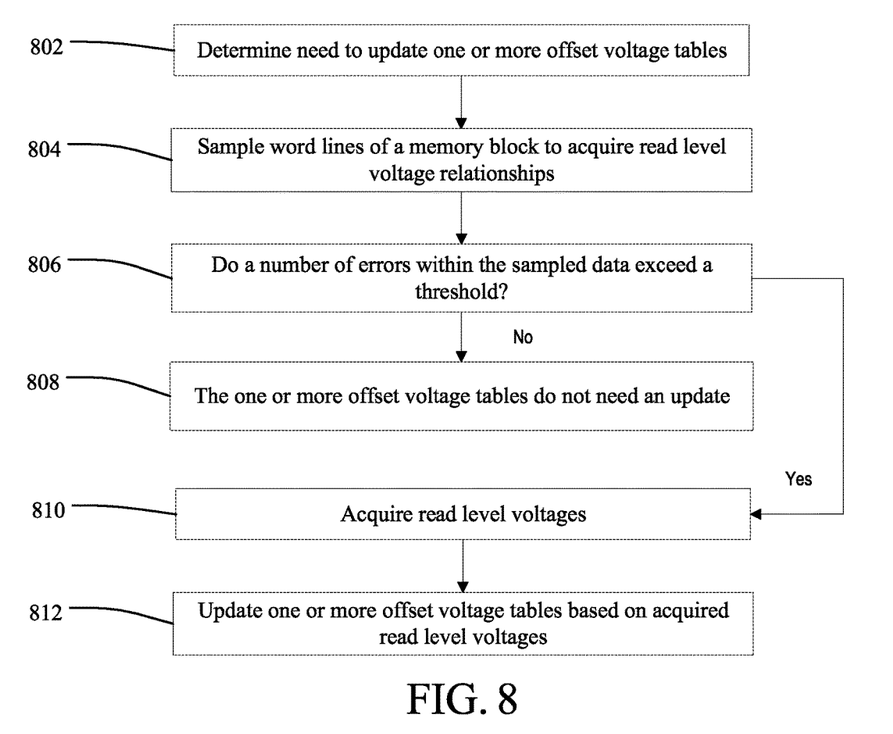
FIG. 8 is a flow chart of one method for generating and/or updating one or more offset voltage lookup tables that include read level voltage relationships between word lines of a memory block.

FIG. 8 is a flow chart of one method for updating one or more offset voltage lookup tables that include read level voltage relationships between word lines of a memory block. At step 802, a read level voltage acquisition module of a controller of a non-volatile memory system determines a need to generate an updated offset voltage lookup table during operation of the non-volatile memory system. In some implementations, the read level voltage acquisition module may determine a need to generate the offset voltage lookup table after a number of errors within sampled data exceeds a threshold; periodically after a defined number of program, erase, read, and/or disturb operations occurs at the non-volatile memory system; based on a time of a write to increase date retention; and/or any other reason that may indicate that the voltage offsets within the offset voltage lookup table may no longer be valid.

At step 804, the controller samples data read from word lines of the memory block, and at step 806, the controller determines whether a number of errors within the sampled data exceeds a threshold. In one example, the threshold may be set at 30 bits in error within an ECC doe word. However, it will be appreciated that other thresholds may be used.

When the number of errors within the sampled data does not exceed the threshold, the controller determines at step 808 that the one or more offset lookup tables are valid and does not generate updated tables.

However, when the number of errors within the sampled data exceeds the threshold, the controller acquires the read level voltages for the word lines of the memory block at step 810. Based on the acquired read level voltages, at step 812, the controller generates one or more updated offset voltage lookup tables. Updating the offset voltage lookup tables may include both changing an amount of offset voltage added to an acquired read level voltage and changing which word lines are related to each other within the offset voltage lookup table.

For example, prior to an update, offset voltage lookup tables may show that word line 0 is related to word line 1 such that an offset of 1 DAC should be applied to word line 1 in addition to a read level acquired at word line 0. Additionally, prior to an update, the offset voltage lookup tables may show that word line 0 is also related to word line 4 such that an offset of 2 DAC should be applied to word line 4 in addition to a read level acquired at word line 0.

After the update, the offset voltage lookup tables may show that word line 0 is still related to word line 1. However, rather than an offset of 1 DAC, the offset voltage lookup table shows that 2 DAC should be applied to word line 1 in addition to a read level acquired at word line 0.

Further, after the update, the offset voltage lookup tables may show that word line 0 is no longer related to word line 4. Instead, the offset voltage lookup table may show that word line 4 is not related to any other word line or the offset voltage lookup table may show that word line 4 is related to a new word line. For example, the offset voltage lookup table may show that word line 2 is related to word line 4 such that an offset of 2 DAC should be applied to word line 4 in addition to a read level acquired at word line 2.

Figure 9:
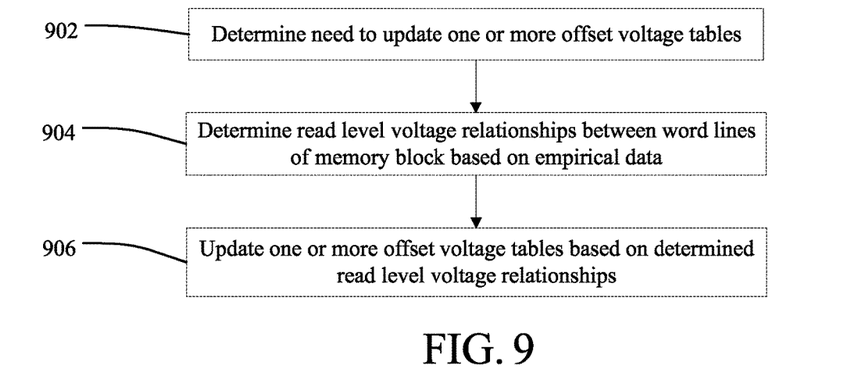
FIG. 9 is a flow chart of another method for generating and/or updating one or more offset voltage lookup tables that include read level voltage relationships between word lines of a memory block.

FIG. 9 is a flow chart of another method for generating one or more offset voltage lookup tables that include read level voltage relationships between word lines of a memory block. At step 902, a read level voltage acquisition module of a controller of a non-volatile memory system determines a need to generate an updated offset voltage lookup table during operation of the non-volatile memory system. As discussed above, the read level voltage acquisition module may determine a need to generate the offset voltage lookup table after a number of errors within sampled data exceeds a threshold; periodically after a defined number of program, erase, read, and/or disturb operations occurs at the non-volatile memory system; after a set period of time in order to improve data retention; and/or any other reason that may indicate that the voltage offsets within the offset voltage lookup table may no longer be valid.

At step 904, the read level voltage acquisition module determines read level voltage relationships between the word lines of a memory block based on empirical data. In some implementations, the read level acquisition module analyzes empirical data collected at similar non-volatile memory systems and stored at the non-volatile memory system to determine the read level voltages relationships. By analyzing the empirical data, the read level voltage acquisition unit is able to determine historically, which word lines have the same read level voltages and/or which word lines have read level voltages that are offset by defined amounts, such as +1 DAC or +2 DAC.

In some implementations, as part of step 904, the read level voltage acquisition module may test the read level voltages that were determined based on the empirical data to examine if any errors are within the sampled data. When errors are detected, the read level voltage acquisition module may acquire a read level voltage of one or more word lines where errors were present in the sampled data in order to dynamically adjust the read level voltages based on actual performance of the memory block.

At step 906, the read level voltage acquisition module generates and/or updates an offset voltage lookup table based on the relationships between the word lines of the memory block determined at step 904.

FIGS. 1-9 illustrate systems and methods for sampling data at a non-volatile memory system. As discussed above, non-volatile memory systems may utilize one or more offset voltage lookup tables that allow a controller and a read level voltage acquisition module of the controller to efficiently verify data at a first memory block of the non-volatile memory system before transferring the data to a second memory block of the non-volatile memory system. To efficiently verify data, the controller and the read level voltage acquisition module sample data stored at a memory block based on relationships between word lines of the memory blocks and characteristics of the non-volatile memory system such as a life stage of the memory block, a program/erase count of the memory block, a program/disturb count of the memory block, a read/disturb count of the memory block, and/or a level of data retention of the memory block. Further, during operation of the non-volatile memory system, the read level acquisition module is able to dynamically update the relationships between the word lines of a memory block.

It is intended that the foregoing detailed description be regarded as illustrative rather than limiting, and that it be understood that it is the following claims, including all equivalents, that are intended to define the spirit and scope of this invention.

For example, in the present application, semiconductor memory devices such as those described in the present application may include volatile memory devices, such as dynamic random access memory ("DRAM") or static random access memory ("SRAM") devices, non-volatile memory devices, such as resistive random access memory ("ReRAM"), electrically erasable programmable read only memory ("EEPROM"), flash memory (which can also be considered a subset of EEPROM), ferroelectric random access memory ("FRAM"), and magnetoresistive random access memory ("MRAM"), and other semiconductor elements capable of storing information. Each type of memory device may have different configurations. For example, flash memory devices may be configured in a NAND or a NOR configuration.

The memory devices can be formed from passive and/or active elements, in any combinations. By way of non-limiting example, passive semiconductor memory elements include ReRAM device elements, which in some embodiments include a resistivity switching storage element, such as an anti-fuse, phase change material, etc., and optionally a steering element, such as a diode, etc. Further by way of non-limiting example, active semiconductor memory elements include EEPROM and flash memory device elements, which in some embodiments include elements containing a charge storage region, such as a floating gate, conductive nanoparticles, or a charge storage dielectric material.

Multiple memory elements may be configured so that they are connected in series or so that each element is individually accessible. By way of non-limiting example, flash memory devices in a NAND configuration (NAND memory) typically contain memory elements connected in series. A NAND memory array may be configured so that the array is composed of multiple strings of memory in which a string is composed of multiple memory elements sharing a single bit line and accessed as a group. Alternatively, memory elements may be configured so that each element is individually accessible, e.g., a NOR memory array. NAND and NOR memory configurations are exemplary, and memory elements may be otherwise configured.

The semiconductor memory elements located within and/or over a substrate may be arranged in two or three dimensions, such as a two dimensional memory structure or a three dimensional memory structure.

In a two dimensional memory structure, the semiconductor memory elements are arranged in a single plane or a single memory device level. Typically, in a two dimensional memory structure, memory elements are arranged in a plane (e.g., in an x-z direction plane) which extends substantially parallel to a major surface of a substrate that supports the memory elements. The substrate may be a wafer over or in which the layer of the memory elements are formed or it may be a carrier substrate which is attached to the memory elements after they are formed. As a non-limiting example, the substrate may include a semiconductor such as silicon.

The memory elements may be arranged in the single memory device level in an ordered array, such as in a plurality of rows and/or columns. However, the memory elements may be arrayed in non-regular or non-orthogonal configurations. The memory elements may each have two or more electrodes or contact lines, such as bit lines and word lines.

A three dimensional memory array is arranged so that memory elements occupy multiple planes or multiple memory device levels, thereby forming a structure in three dimensions (i.e., in the x, y and z directions, where the y direction is substantially perpendicular and the x and z directions are substantially parallel to the major surface of the substrate).

As a non-limiting example, a three dimensional memory structure may be vertically arranged as a stack of multiple two dimensional memory device levels. As another non-limiting example, a three dimensional memory array may be arranged as multiple vertical columns (e.g., columns extending substantially perpendicular to the major surface of the substrate, i.e., in the y direction) with each column having multiple memory elements in each column. The columns may be arranged in a two dimensional configuration, e.g., in an x-z plane, resulting in a three dimensional arrangement of memory elements with elements on multiple vertically stacked memory planes. Other configurations of memory elements in three dimensions can also constitute a three dimensional memory array.

By way of non-limiting example, in a three dimensional NAND memory array, the memory elements may be coupled together to form a NAND string within a single horizontal (e.g., x-z) memory device levels. Alternatively, the memory elements may be coupled together to form a vertical NAND string that traverses across multiple horizontal memory device levels. Other three dimensional configurations can be envisioned wherein some NAND strings contain memory elements in a single memory level while other strings contain memory elements which span through multiple memory levels. Three dimensional memory arrays may also be designed in a NOR configuration and in a ReRAM configuration.

Typically, in a monolithic three dimensional memory array, one or more memory device levels are formed above a single substrate. Optionally, the monolithic three dimensional memory array may also have one or more memory layers at least partially within the single substrate. As a non-limiting example, the substrate may include a semiconductor such as silicon. In a monolithic three dimensional array, the layers constituting each memory device level of the array are typically formed on the layers of the underlying memory device levels of the array. However, layers of adjacent memory device levels of a monolithic three dimensional memory array may be shared or have intervening layers between memory device levels.

Then again, two dimensional arrays may be formed separately and then packaged together to form a non-monolithic memory device having multiple layers of memory. For example, non-monolithic stacked memories can be constructed by forming memory levels on separate substrates and then stacking the memory levels atop each other. The substrates may be thinned or removed from the memory device levels before stacking, but as the memory device levels are initially formed over separate substrates, the resulting memory arrays are not monolithic three dimensional memory arrays. Further, multiple two dimensional memory arrays or three dimensional memory arrays (monolithic or non-monolithic) may be formed on separate chips and then packaged together to form a stacked-chip memory device.

Associated circuitry is typically required for operation of the memory elements and for communication with the memory elements. As non-limiting examples, memory devices may have circuitry used for controlling and driving memory elements to accomplish functions such as programming and reading. This associated circuitry may be on the same substrate as the memory elements and/or on a separate substrate. For example, a controller for memory read-write operations may be located on a separate controller chip and/or on the same substrate as the memory elements.

One of skill in the art will recognize that this invention is not limited to the two dimensional and three dimensional exemplary structures described but cover all relevant memory structures within the spirit and scope of the invention as described herein and as understood by one of skill in the art.

The invention claimed is:

1. In a controller of a non-volatile memory system that is coupled with a host device, a method comprising:
    acquiring a read level voltage of a first word line of a memory block of a non-volatile memory of the non-volatile memory system;
    accessing one or more lookup tables to determine an offset voltage for a second word line of the memory block based on both a program/erase count and a read/disturb count associated with the memory block, where the offset voltage is offset from the read level voltage of the first word line;
    applying the read level voltage and the offset voltage to the second word line to sample data stored at the memory block; and
    determining whether the data sampled from the memory block contains errors.

2. The method of claim 1, wherein the memory block comprises single level memory cells.

3. The method of claim 1, further comprising:
    in response to determining that the memory block does not contain errors, copying the data of the memory block to a new memory block.

4. The method of claim 3, wherein the new memory block comprises multi level memory cells.

5. The method of claim 4, wherein the multi level memory cells are triple level memory cells.

6. The method of claim 1, further comprising:
    updating the one or more lookup tables to adjust the offset voltage between the first word line and the second word line.

7. The method of claim 6, wherein the one or more lookup tables are updated in response to a determination that a number of errors in the data stored at the memory block exceeds a threshold.

8. The method of claim 6, wherein the one or more lookup tables are updated periodically after a defined number of operations at the non-volatile memory system.

9. The method of claim 6, wherein updating the one or more lookup tables comprises:

acquiring a read level voltage relationship between the word lines of the memory block.

10. The method of claim 9, wherein empirical data collected at the non-volatile memory system is analyzed to acquire the read level voltage relationships between the word lines of the memory block.

11. An apparatus comprising:
a non-volatile memory; and
a controller in communication with the non-volatile memory, the controller configured to:
acquire a read level voltage of a first word line of a memory block of the non-volatile memory;
determine an offset voltage for a second word line of the memory block based on both a program/erase count and a read/disturb count associated with the memory block, where the offset voltage is offset from the read level voltage of the first word line;
sample data stored at the memory block using the read level voltage and the offset voltage.

12. The apparatus of claim 11, wherein the offset voltage for the second word line is further determined based on at least one other characteristic of the memory block comprising a life stage of the memory block, a program/disturb count of the memory block, or a level of data retention of the memory block.

13. The apparatus of claim 11, wherein the controller is further configured to update the offset voltage between the first word line and the second word line of the memory block based on one or more characteristics of the memory block.

14. The apparatus of claim 13, wherein the controller is configured to update the offset voltage in response to a determination that a number of errors in the data sampled from the memory block exceeds a threshold.

15. The apparatus of claim 13, wherein the controller is configured to periodically update the offset voltage after a defined number of operations at the non-volatile memory system.

16. In a controller of a non-volatile memory system that is coupled with a host device, a method comprising:
updating one or more lookup tables to reflect a relationship between a read level voltage of a first word line of a memory block of a non-volatile memory of the non-volatile memory system and a read level voltage of a second word line of the memory block;
wherein the relationship between the read level voltage of the first word line and the read level voltage of the second word line is updated based on at least a program/erase count of the memory block and a read/disturb count of the memory block.

17. The method of claim 16, wherein the one or more lookup tables are updated in response to a determination that a number of errors in data stored at the memory block exceeds a threshold.

18. The method of claim 16, wherein the one or more lookup tables are updated periodically after a defined number of operations at the non-volatile memory system.

19. The method of claim 6, wherein updating the one or more lookup tables comprises:
analyzing empirical data collected at the non-volatile memory system to acquire a read level voltage relationship between the first word line and the second word line of the memory block.

20. The method of claim 19, further comprising:
collecting the empirical data at the non-volatile memory system.

* * * * *